US 8,411,792 B2

(12) United States Patent
Pinon (10) Patent No.: US 8,411,792 B2
(45) Date of Patent: Apr. 2, 2013

(54) DIGITAL PREDISTORTER FOR VARIABLE SUPPLY AMPLIFIER

(75) Inventor: Vincent Pinon, Saint Egréve (FR)

(73) Assignee: STMicroelectronics S.A., Montrouge (FR)

( * ) Notice: Subject to any disclaimer, the term of this patent is extended or adjusted under 35 U.S.C. 154(b) by 324 days.

(21) Appl. No.: 12/849,270

(22) Filed: Aug. 3, 2010

(65) Prior Publication Data

US 2011/0032032 A1    Feb. 10, 2011

(30) Foreign Application Priority Data

Aug. 5, 2009  (FR) ...................................... 09 55501

(51) Int. Cl.
*H04K 1/02* (2006.01)
(52) U.S. Cl. ........................................................ 375/297
(58) Field of Classification Search .................... 375/297
See application file for complete search history.

(56) References Cited

U.S. PATENT DOCUMENTS

| 5,049,832 | A  | * | 9/1991  | Cavers ........................... 330/149 |
| 6,072,364 | A  | * | 6/2000  | Jeckeln et al. .................. 330/149 |
| 6,459,334 | B2 | * | 10/2002 | Wright et al. ...................... 330/2 |
| 6,587,513 | B1 | * | 7/2003  | Ichihara ........................ 375/296 |
| 7,259,630 | B2 | * | 8/2007  | Bachman et al. .............. 330/297 |

| 2005/0017801 | A1 |   | 1/2005 | Bachman, II et al. |
| 2006/0209984 | A1 |   | 9/2006 | Kenington |
| 2010/0035554 | A1 | * | 2/2010 | Ba et al. ........................ 455/63.1 |

FOREIGN PATENT DOCUMENTS

WO    WO 2008088025 A1    7/2008

OTHER PUBLICATIONS

Li, "A Fast Digital Predistortion Algorithm for Radio-Frequency Power Amplifier Linearization With Loop Delay Compensation," IEEE Journal of Selected Topics in Signal Processing, vol. 3, No. 3, Jun. 2009.*
French Search Report dated Feb. 19, 2010 from corresponding French Application No. 09/55501.

* cited by examiner

*Primary Examiner* — Juan A Torres
(74) *Attorney, Agent, or Firm* — Wolf, Greenfield & Sacks, P.C.

(57) ABSTRACT

An adaptive predistorter for applying a predistortion gain to an input signal to be amplified by a power amplifier having a variable supply voltage, the predistorter including: a predistortion gain block adapted to apply a complex gain to a complex input signal; a first table implemented in a first memory and including a 2-dimensional array of cells storing complex gain values, the first table adapted to output the complex gain values based on an amplitude of the input signal and the value of the variable supply voltage of the power amplifier; and a second table implemented in a second memory and including a 2-dimensional array of cells storing gain update values for updating the complex gain values of the first table, the gain update values being generated based on an output of the power amplifier.

26 Claims, 2 Drawing Sheets

DIGITAL PREDISTORTER FOR VARIABLE SUPPLY AMPLIFIER

CROSS REFERENCE TO RELATED APPLICATIONS

This application claims the priority benefit of French patent application Ser. No. 09/55501, filed on Aug. 5, 2009, entitled "Digital Predistorter For Variable Supply Applications," which is hereby incorporated by reference to the maximum extent allowable by law.

FIELD OF THE INVENTION

The present invention relates to a digital predistorter, and to an amplification circuit arrangement comprising a digital predistorter for providing adaptive predistortion at the input of a variable supply power amplifier.

BACKGROUND TO THE INVENTION

Variable supply power amplifiers use envelope tracking to vary the supply voltage based on the amplitude of the input signal, and thereby reduce power consumption. Such amplifiers are for example used to amplify a radio frequency (RF) signal prior to transmission over a transmission channel.

Figure 1:
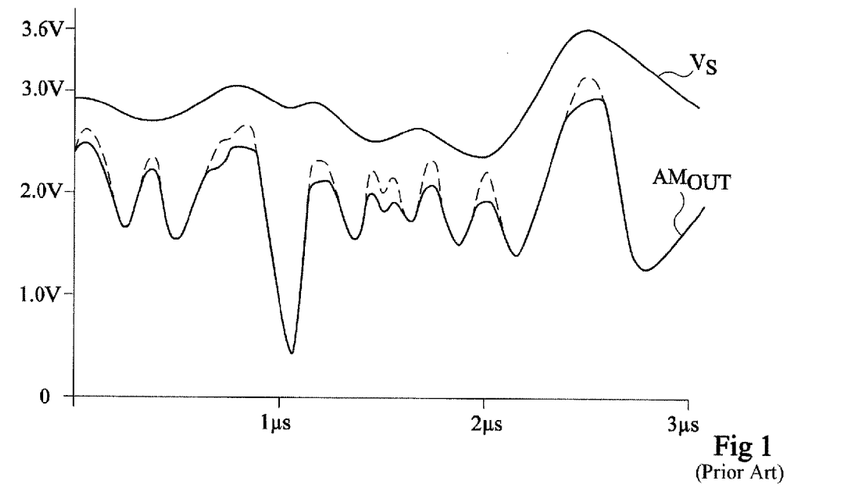
FIG. 1 (described above) shows a graph of the amplitude of an output signal from a power amplifier and a corresponding variable supply voltage according to one example.

FIG. 1 is a graph showing a variable supply voltage $V_S$ and the amplitude $AM_{OUT}$ of the corresponding RF signal at the output of a power amplifier supplied by the variable supply voltage $V_S$.

The dashed lines in FIG. 1 illustrate the ideal output signal waveform, and demonstrate the problem of clipping at the signal peaks of the output signal. This problem occurs when the amplitude of the output signal becomes close to the level of the variable supply voltage $V_S$, and the power amplifier thus becomes saturated, distorting the output signal. This distortion is undesirable in many applications such as in wireless communications, where it increases the bandwidth occupied by the transmitted signal.

It has been proposed to provide an adaptive predistorter that adjusts, in advance, the gain and phase of portions of the input signal before it is amplified by the power amplifier.

However, a difficulty with such adaptive predistorters is that the gain to be applied depends on several variables, for example on both the level of the input signal and the level of the variable supply voltage. Existing solutions tend to be either complex to implement, or demanding on memory resources and slow to calibrate.

SUMMARY OF THE INVENTION

Embodiments of the present invention aim to at least partially address one or more problems in the prior art.

According to one aspect of the present invention, there is provided an adaptive predistorter for applying a predistortion gain to an input signal to be amplified by a power amplifier having a variable supply voltage ($V_S$), the predistorter comprising: a predistortion gain block adapted to apply a complex gain to a complex input signal; a first table implemented in a first memory and comprising a 2-dimensional array of cells storing complex gain values, the first table adapted to output said complex gain values based on an amplitude of the input signal and the value of the variable supply voltage of the power amplifier; and a second table implemented in a second memory and comprising a 2-dimensional array of cells storing gain update values for updating the complex gain values of the first table, the gain update values being generated based on an output signal of said power amplifier.

According to one embodiment, the complex gain values in said first table are in Cartesian format, and wherein said gain update values in said second table are complex values also in Cartesian format.

According to another embodiment, the predistorter further comprises a table update block adapted to generate updated complex gain values based on said complex gain values of the first table and the gain update values of the second table.

According to another embodiment, the table update block is adapted to update the complex gain values based on the following calculation for each address in the first table: $G'_{x,y} = G_{x,y} \cdot G_{2x,y}$, where $G'_{x,y}$ is the new complex gain value corresponding to address x,y of the first table, $G_{x,y}$ is the previous complex gain value at address x,y of the first table and $G_{2x,y}$ is the gain update value at address x,y of the second table.

According to another embodiment, the predistorter further comprises a feedback control block adapted to generate said gain update values based on the complex input signal, the output signal of said power amplifier and a previous gain update value stored in said second table.

According to another embodiment, a first order IIR (infinite impulse response) filtering function is applied when generating said gain update values, based on the following calculation: $G_{2'x,y} = G_{2x,y} + (G_{2x,y} - m)\alpha$ wherein $G_{2'x,y}$ is a new gain update value to be stored at address x,y in the second table, $G_{2x,y}$ is the previous gain update value at address x,y in the second table, m is a gain ratio equal to the complex input signal divided by the output signal of the power amplifier, and $\alpha$ is a constant.

According to another embodiment, the first and second tables are each addressed by a column address based on the variable supply voltage and a row address, wherein the row address of the first table is based on the amplitude of the complex input signal and the row address of the second table is based on the amplitude of the output signal of the power amplifier.

According to another embodiment, the row address input to the first table is equal to: $(AM_{IN}[n]/V_S[n])$, and the row address input to the second table is equal to: $(AM_{OUT}[n]/V_S[n])$, wherein $AM_{IN}[n]$ is the amplitude of the complex input signal and $AM_{OUT}[n]$ is the amplitude of the complex output signal of the power amplifier converted into digital format and $V_S[n]$ is the variable supply voltage converted into digital format.

According to another embodiment, the row address input to the first table is equal to: $(AM_{IN}[n]/V_S[n])^2$, and the row address input to the second table is equal to: $(AM_{OUT}[n]/V_S[n])^2$, wherein $AM_{IN}[n]$ is the amplitude of the complex input signal and $AM_{OUT}[n]$ is the amplitude of the complex output signal of the power amplifier converted into digital format and $V_S[n]$ is the variable supply voltage converted into digital format.

According to another embodiment, the roles of the first and second tables are exchanged periodically.

According to another aspect of the present invention, there is provided an amplification circuit arrangement comprising: the above predistorter for applying a predistortion gain to an input signal; a first RF converter for converting the predistorted input signal to an analog signal at a transmission frequency; and a power amplifier for amplifying the analog signal, the power amplifier being powered by a variable supply voltage.

According to yet a further aspect of the present invention, there is provided an electronic device comprising: modulation circuitry for generating the complex input signal; and the above amplification circuit arrangement.

According to yet a further aspect of the present invention, there is provided a method of applying a predistortion gain to a complex input signal to be amplified by a power amplifier having a variable supply voltage, comprising: applying to the complex input signal, by a predistortion gain block, complex gain values extracted from a first table comprising a 2-dimensional array of cells storing complex gain values, said complex gain values being extracted based on an amplitude of the complex input signal, and a value of the variable supply voltage of the power amplifier; and accumulating in a 2-dimensional array of a second table gain update values for updating the complex gain values of the first table, the gain update values being generated based on an output signal of said power amplifier.

According to one embodiment, the method further comprises periodically switching the roles of said first and second tables such that said first table is used for accumulating a 2-dimensional array of gain update values generated based on an output signal of said power amplifier, and the second table is used for providing said complex gain values.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 2:
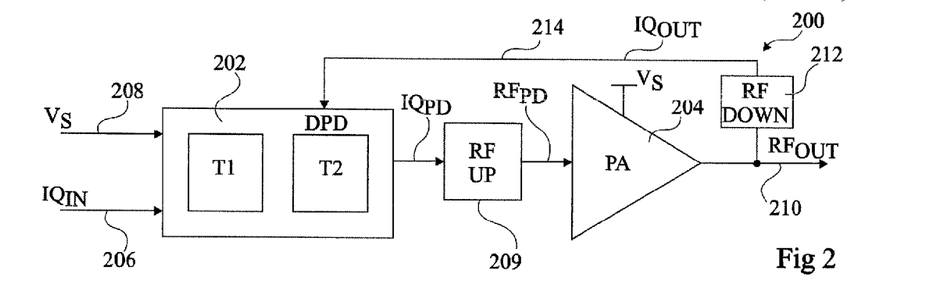
FIG. 2 illustrates an amplification circuit according to an embodiment of the present invention.

FIG. 2 illustrates an amplification circuit 200 comprising a digital predistorter (DPD) 202 and a power amplifier (PA) 204. The power amplifier 204 is powered by a variable supply voltage $V_S$, which is varied (by circuitry not shown in FIG. 2) using envelope tracking based on the level of an input modulation signal $IQ_{IN}$. The predistorter 202 receives, on an input line 206, the input modulation signal $IQ_{IN}$ prior to frequency translation and, on an input line 208, the variable supply voltage $V_S$.

Predistorter 202 determines, using a 2D look-up table T1 of complex gains in Cartesian format (i+jq), and based on the amplitude of the input signal $IQ_{IN}$ and the level of the variable supply voltage $V_S$, the complex predistortion gain to be applied to the input signal. This gain is applied to the input signal $IQ_{IN}$ to generate a predistorted signal $IQ_{PD}$, which is provided to the input of an RF UP block 209. RF UP block 209 up converts the signal $IQ_{PD}$ to an RF signal $RF_{PD}$ at a desired transmission frequency, which is provided to the input of the power amplifier 204. The power amplifier 204 amplifies this signal to generate an RF output signal $RF_{OUT}$ on an output line 210 for transmission over a transmission channel (not shown in FIG. 2).

The output signal $RF_{OUT}$ is also provided to an RF DOWN block 212, which down converts the RF signal to a baseband signal $IQ_{OUT}$, which is provided on a feedback line 214 to the predistorter 202.

A table T1 is used to provide predistortion gain values, and a table T2 is used to store gain update values determined using the output signal $IQ_{OUT}$ from the RF DOWN block 212. Periodically, the gain update values accumulated in table T2 are used to update the gain values in table T1. The tables T1 and T2 are, for example, implemented in respective memory arrays having the same dimensions as each other.

Figure 3:
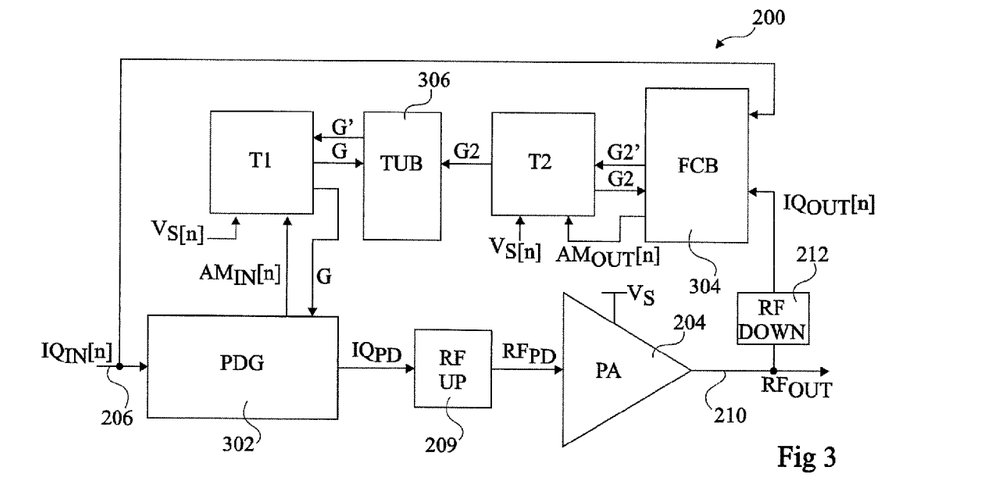
FIG. 3 illustrates the amplification circuit of FIG. 2 in more detail.

FIG. 3 illustrates the amplification circuit 200 in more detail according to one embodiment. In addition to the look-up tables T1 and T2, the digital predistorter 202 comprises a predistortion gain block (PDG) 302, a feedback control block (FCB) 304, and a table update block (TUB) 306.

The predistortion gain block 302 applies, to digital input modulation signal values $IQ_{IN}[n]$ received on input line 206, complex gain values G retrieved from look-up table T1. The gain values G from table T1 are selected according to an amplitude value $AM_{IN}[n]$ of the input signal and the level $V_S[n]$ of the variable supply voltage.

Table T1 comprises a 2D memory array, wherein each column for example corresponds to a different supply voltage value and each row corresponds to a different input signal amplitude value. The memory array comprises, for each combination of the supply voltage and input signal amplitude values, a corresponding complex gain value G in Cartesian format. In one example, the array comprises 8 columns corresponding to 8 different supply voltage values, and 16 rows corresponding to 16 different input signal amplitude values, although in alternative embodiments there could be between 2 and several hundred columns and between 2 and several hundred rows. Obviously, the columns and rows could be switched such that the columns correspond to input signal amplitude values and the rows to the supply voltage values.

The table T1 is addressed by digital words $x_1[n]$, $y_1[n]$, which are functions of the supply voltage values $V_S[n]$, for example provided by a supply voltage controller (not shown in FIG. 3), and the digital input signal amplitude samples $AM_{IN}[n]$, based on the amplitude of the input signal values. In one example, $x_1[n]=V_S[n]$ and $y_1[n]=AM_{IN}[n]=|IQ_{IN}[n]|$, where $|IQ_{IN}[n]|$ is the modulus of the complex value of the input signal $IQ_{IN}[n]$. Alternatively, as will be explained below, other functions may be applied to the amplitude of the input signal to generate the signal $y_1[n]$.

Each of the digital values $x_1[n]$ and $y_1[n]$, for example, comprises a number of bits corresponding to the number of corresponding columns and rows in the table T1 respectively. Assuming there are 8 columns corresponding to supply voltage levels, the values $x_1[n]$, and for example also the values $V_S[n]$, are 3 bits, and assuming there are 16 rows corresponding to the input amplitude, the values $y_1[n]$, and for example also the values $AM_{IN}[n]$, are 4 bits. This leads to a simple mapping between the address of the table T1 and the variables $AM_{IN}[n]$ and $V_S[n]$.

The table T2 is the same as table T1, except that in this example, rather than the address values of the second table being based on the input signal amplitude values $AM_{IN}[n]$ and the supply voltage values $V_S[n]$, they are based on output signal amplitude values $AM_{OUT}[n]$ sampled from the output signal $RF_{OUT}$, and the supply voltage values $V_S[n]$. Thus the gain update values in table T2 correspond to the reciprocals of the power amplifier gain. During generation of the gain update values in table T2, temporary values "$G_2$" are stored in the table. These values are modified iteratively, before being used to update the gain values G in table T1.

Rather than being directly equal to the amplitudes of the input and output signals $AM_{IN}[n]$ and $AM_{OUT}[n]$, the values $x_1[n]$, $y_1[n]$ used to address table T1 and the values $x_2[n]$, $y_2[n]$ used to address table T2 could be determined based on more complex function of these signals, taking into account the properties of these signals and of the power amplifier. For example, for an envelope tracking power amplifier with a signal modulated by quadrature phase shift keying (QPSK), addressing could be based on the drive signal to supply ratio, equal to the amplitude of the input and output signals divided by the supply voltage. In other words, the tables could be addressed by $\{V_S[n], \text{backofff}[n]\}$, where, in the case of table T1:

$y_1[n] = \text{backoff}_{IN}[n] = AM_{IN}[n]/V_S[n]$, and in the case of table T2:

$y_2[n] = \text{backoff}_{OUT}[n] = AM_{OUT}[n]/V_S[n]$.

In this example, the division by $V_S[n]$ is relatively simple, as $V_S[n]$ varies slowly and has few possible values. Other functions are possible, such as:

$y_1[n] = AM_{IN}[n]^2/V_S[n]^2$, and $y_2[n] = AM_{OUT}[n]^2/V_S[n]^2$

In this example, the division by $V_S[n]$ is relatively simple, as $V_S[n]$ varies slowly and has few possible values. Other functions are possible, such as:

$y_1[n] = AM_{IN}[n]^2/V_S[n]^2$, and $y_2[n] = AM_{OUT}[n]^2/V_S[n]^2$

Advantageously, by selecting an appropriate function based on the characteristics of the signals, the samples will not be concentrated within a small region of the table, but will be relatively evenly dispersed throughout the table, meaning that a small table can provide high precision. Interpolation of the input ranges could also be performed to increase linearity even more. It will be apparent to those skilled in the art that there is a trade-off between complexity of the function applied to the input variables, and the size of the table.

The feedback control block 304 receives the digital input values $IQ_{IN}[n]$ and the digital output values $IQ_{OUT}[n]$, and based on these values, calculates corresponding gain update values $G_2$ in table T2. In particular, on each cycle, block 304 generates an output amplitude value $AM_{OUT}[n]$ based on the digital output value $IQ_{OUT}[n]$, and provides this value to table T2. Table T2 also receives the current supply voltage value $V_S[n]$, and outputs the gain update value $G_2$ from the corresponding address to block 304. Block 304 then generates the new value $G_2'$ based on the values of $IQ_{IN}[n]$, $IQ_{OUT}[n]$ and $G_2$, and writes this value to the same address in table T2.

The table update block 306 periodically updates the gain values G in table T1 based on the gain update values in table T2. For this, each previous gain value G from table T1 and corresponding gain update value $G_2$ from table T2 are provided in turn to block 306, which generates a new gain value G' to replace the existing value G in table T1.

In some embodiments, the updating of table T1 can be performed in parallel to the continuing functioning of the predistortion gain block 302. Alternatively, table T1 can be updated periodically at times when there is no input signal, such as between two transmission time slots, or during a synchronization phase.

Figure 4:
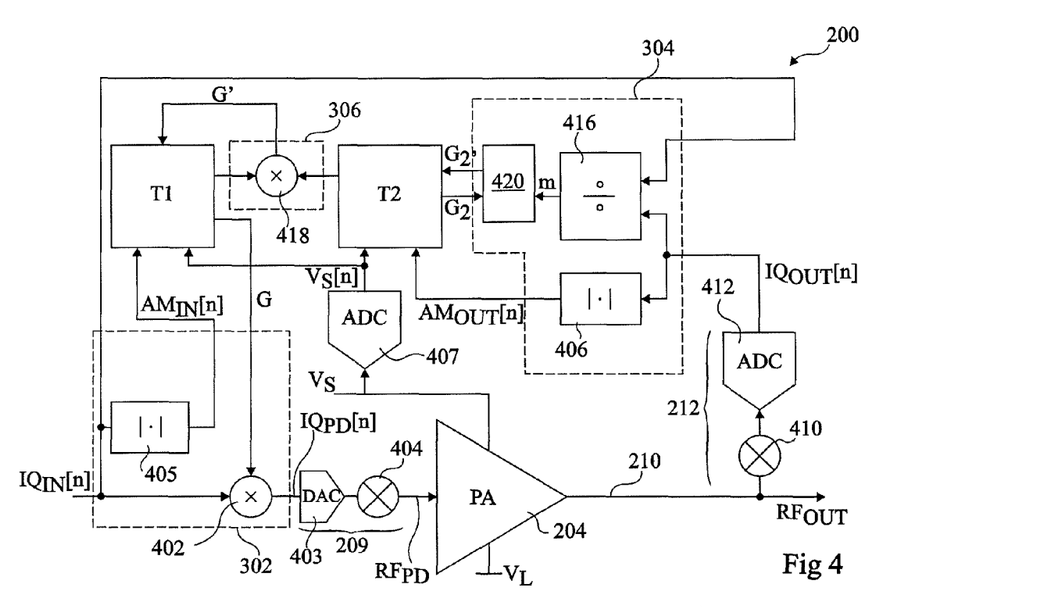
FIG. 4 illustrates the amplification circuit of FIG. 2 in yet more detail.

FIG. 4 illustrates an example of the structure of the amplification circuit 200 in yet more detail.

The predistortion gain block 302 comprises a multiplier 402, which multiplies the complex digital input signal $IQ_{IN}[n]$ by a corresponding complex gain value G provided by table T1 to provide the complex digital predistorted signal $IQ_{PD}[n]$. This signal is provided to the RF UP block 209, which comprises a DAC (digital to analog converter) 403, which converts the digital signal $IQ_{PD}[n]$ to an analog signal, and a mixer 404, which frequency shifts the analog signal to provide the signal $RF_{PD}$ at the desired transmission frequency.

The input and output signals $IQ_{IN}$ and $IQ_{OUT}$ are complex values represented in the Cartesian form "i+jq". The predistortion gain block 302 and feedback control block 304 comprise respective amplitude extraction blocks 405, 406. Block 405 determines the amplitude $|AM_{IN}[n]|$ as $\sqrt{(i_{IN}^2 + q_{IN}^2)}$, where $i_{IN}$ and $q_{IN}$ are the real and imaginary parts respectively of $IQ_{IN}[n]$, and block 406 determines the amplitude $|AM_{OUT}[n]|$ as $\sqrt{(i_{OUT}^2 + q_{OUT}^2)}$, where $i_{OUT}$ and $q_{OUT}$ are the real and imaginary parts respectively of $IQ_{OUT}[n]$. In the case that the tables T1 and T2 are addressed directly by the amplitudes $AM_{IN}[n]$ and $AM_{OUT}[n]$, these amplitudes are output as the signals $y_1[n]$ and $y_2[n]$ to tables T1 and T2 respectively. Alternatively, in the case that an alternative function of the amplitudes is used as described above, the amplitude extraction blocks 405 and 406 for example also apply this function.

The variable supply voltage values $V_S[n]$ provided to tables T1 and T2 are for example generated by sampling the supply voltage $V_S$ by an ADC 407. Alternatively, as mentioned above, they could be provided directly by a supply control block (not shown in FIG. 4).

The RF DOWN block 212 comprises a mixer 410, which receives the output signal $RF_{OUT}$ of the power amplifier 204 on line 210 and down converts this signal from the radio frequency to the baseband, and an ADC 412, which samples the baseband RF signal to provide the digital values $IQ_{OUT}[n]$. The input signal $IQ_{IN}[n]$ is also provided to the FCB 304. The signals $IQ_{IN}[n]$ and $IQ_{OUT}[n]$ for example comprise samples of 10 bits at a rate of 30 MHz for each of the real and imaginary components. Alternatively, the input signal may be provided to the FCB in analog form, and sampled by a further ADC (not shown in FIG. 4) to provide the digital signal. Furthermore, either or both of the signals $IQ_{IN}[n]$ and $IQ_{OUT}[n]$ may be sampled by further sampling circuitry to adapt the sampling rate to the rate used by the FCB 304.

The FCB 304 comprises a division unit 416, which divides the input signal $IQ_{IN}[n]$ by the output signal $IQ_{OUT}[n]$ to generate a complex gain ratio m, which is a gain correction inverted with respect to the gain applied by both the amplification circuits 302 and 204. The FCB 304 also comprises an iterative update module 420, which updates values in table T2. In particular, module 420 receives the complex gain ratios m from the division unit 416, for example in 10 bits, as well as a current value $G_2$ from table T2, addressed based on the current address inputs $V_S[n]$ and $AM_{OUT}[n]$. While other types of filters could be implemented, in the present example the module 420 implements a first order IIR (infinite impulse response) filter to generate each new value $G_2'$ to replace the old value $G_2$, for example using the following calculation:

$G_{2'x,y} = G_{2x,y} + (G_{2x,y} - m)\alpha$ where x corresponds to the column address, determined based on the supply voltage value $V_S[n]$, y corresponds to the row address determined based on the output signal amplitude value $AM_{OUT}[n]$, and $\alpha$ is a value chosen based on the desired filtering of the gain measurement and the rate of convergence of the algorithm. The value $\alpha$ is for example a constant value equal to between $\frac{1}{32}$ and $\frac{1}{2}$, and is for example a power of 2 allowing simplified implementation. Assuming a value of α of 1/X, every cell of the table T2 is for example updated around 2X times in order to obtain an optimal value of $G_2$, with around 10% precision. In practise, some cells of the tables will be updated more often than others, and these cells will converge more rapidly to precise estimations of the gain corrections, while cells that are updated more rarely may have a reduced precision, but will equally have lower impact on the global precision of the correction circuitry.

Alternatively, the value of α could be variable, for example, being selected at the start of each learning phase during which the gain update values are accumulated, based on the desired time period before the next gain update. This may, for example, depend on the type of signal being processed.

At the start of each new learning phase, the gain update values $G_{2x,y}$ throughout the table T2 that have already been applied are for example re-initialized to a neutral gain of 1.

The table update circuitry 306 comprises a multiplier 418, which receives the values at the same address from each of the tables T1 and T2 in turn, and multiplies these values together in order to provide an updated complex gain value G', which is stored in table T1. In other words, the update is based on the following calculation:

$$G'_{x,y} = G_{x,y} \cdot G_{2x,y}$$

where x and y are the column and row addresses respectively, $G'_{x,y}$ is a new value to be stored at address x,y of table T1, $G_{x,y}$ is the previous value stored at address x,y of table T1, and $G_{2x,y}$ is the gain update value stored at address x,y of table T2.

In the embodiment of FIG. 4, table T1 is dedicated to being used as the look-up table for providing the complex gain values G, while table T2 is used for accumulating the complex gain update values $G_2$ used to periodically update the complex gain values of table T1. In alternative embodiments, the roles of the tables T1 and T2 may switched periodically, making the table updating process even more seamless, as will now be described in relation to FIG. 5.

Figure 5:
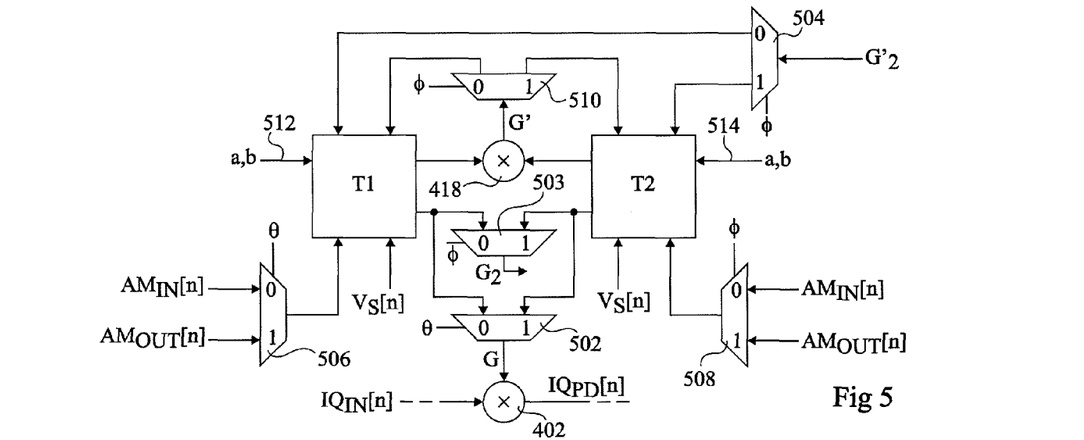
FIG. 5 illustrates an alternative arrangement of look-up tables of the amplification circuit of FIG. 3.

FIG. 5 illustrates the connections to the tables T1 and T2 and multiplier 402 according to an embodiment in which multiplexers are used to periodically switch the roles of the tables.

Multiplier 402 receives the complex gain value G from the output of a multiplexer 502, which comprises two inputs coupled to outputs of the tables T1 and T2 respectively. These outputs of tables T1 and T2 are also coupled to respective inputs of a multiplexer 503, which has its output coupled to the iterative update module 420 of FIG. 4 and provides the previous gain values $G_2$.

Each of the tables T1 and T2 has an input coupled to respective outputs of a multiplexer 504, which has an input coupled to receive updated gain values $G_2'$ from the output of the iterative update module 420. Two multiplexers 506 and 508 each comprises one input coupled to receive the digital amplitude values $AM_{IN}[n]$, and another input coupled to receive the digital amplitude values $AM_{OUT}[n]$. The output of multiplexer 506 is coupled as an address input to table T1, while the output of multiplexer 508 is coupled as an address input to table T2. As previously, the digital variable supply voltage value $V_S[n]$ is coupled to a further address input of each of tables T1 and T2. A multiplexer 510 has an input coupled to the output of multiplier 418, and has two outputs, one of which is coupled to a data input of each of the tables T1 and T2.

The multiplexers 502 and 506 are controlled by a digital timing signal θ, while the multiplexers 503, 504, 508 and 510 are controlled by a digital timing signal φ. The timing signal θ is for example the inverse of the timing signal φ, such that when the timing signal θ is high, the timing signal φ is low, and vice versa.

Each of the tables $T_1$ and $T_2$ is, for example, a dual port memory, such as a dual port RAM (DPRAM), allowing two of its cells to be accessed in a same read or write cycle. Thus secondary address inputs 512 and 514 are, for example, provided in tables T1 and T2 respectively, allowing secondary addresses a,b from the tables to be read and provided to the multiplier 418. As an alternative, the tables T1 and T2 could be operated at twice the data rate of the signal samples, for example at 60 MHz if the signal samples are at a rate of 30 MHz, such that two accesses may occur, in which case no secondary address inputs 512, 514 need be provided.

In operation, assuming that signal θ is initially at logic level "0", and signal φ at logic level "1", table T1 is initially used to provide complex gain values G to multiplier 402, and table T2 is used to accumulate gain update values $G_2$. When the complex gain update values $G_2$ in table T2 are to be used to update the complex gain values G in table T1, the secondary address inputs 512 and 514 are for example used to output the old complex gain values G from table T1 and corresponding gain update values $G_2$ from table T2. The results are stored in the corresponding locations in table T2. Alternatively, in that case that the secondary address inputs 512 and 514 are not provided and the tables are sampled at twice the rate of the signal samples, the normal address inputs of tables T1 and T2 are, for example, used on every other cycle to address the values $G_{x,y}$ and $G_{2x,y}$ to be used for the update.

Once all of the $G_2$ values in table T2 have been replaced by the updated gain values G', the roles of the tables can be switched. Thus signal θ is switched to logic level "1", and signal φ is switched to logic level "0", such that table T2 is used to provide complex gain values G to multiplier 402, and table T1 is used to accumulate gain update values. The above operation then repeats, until the roles of the tables are ready to be switched again.

Figure 6:
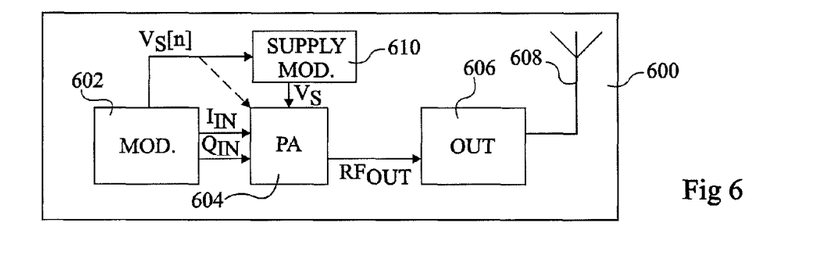
FIG. 6 illustrates an electronic device according to embodiments of the present invention.

FIG. 6 illustrates an electronic device 600, which is for example a mobile telephone, set top box, ADSL (asymmetrical digital subscriber line) router, network adapter or other electronic device having a power amplifier with predistortion. For example, such a device could be used in UMTS (Universal Mobile Telecommunications System), GSM (Global System for Mobile communications), or Bluetooth application.

Device 600 comprises a signal modulator 602, which generates a baseband signal for radio transmission based on information from a data source that is to be transmitted, which, for example, comprises digital data, sound or sensor information. The signal provided by the signal modulator 602 is in Cartesian format, having a real component $I_{IN}$ and imaginary component $Q_{IN}$. This signal is provided to a power amplifier 604, which, for example, comprises the circuitry of any of FIGS. 2 to 5. The power amplifier 604 applies predistortion, RF up-conversion and power amplification to the input signal to provide an output RF signal $RF_{OUT}$. The output RF signal is coupled to amplification circuit 606, which for example comprises filtering and impedance matching networks. The signal is then transmitted over a transmission channel, for example, via an output antenna 608, although in alternative embodiments the transmission channel could be a wired channel.

The power amplifier 604 has its power supply voltage $V_S$ modulated by a supply modulator 610, based on the digital supply signal $V_S[n]$ provided by the signal modulator 602. In some embodiments, this signal may also be provided directly to the power amplifier 604, to provide the digital values $V_S[n]$ of the supply voltage.

An advantage of the embodiments of the predistorter described herein is that, by using two tables, one for providing complex gains for predistortion, and the other for accumulating gain update values, the predistorter has low complexity and low memory requirements.

Furthermore, by providing tables containing complex gains in Cartesian format, these gains may be applied to the input modulation signal $Q_{IN}$ by a simple multiplication operation.

Furthermore, by preparing the gain update values through accumulation of gain measurements in a separate table to the one used for providing the gain values used by the predistorter, measurement errors are filtered during the update procedure in a simple fashion. Complex operations occur only in reduced number at the end of the learning phase, and as they do not need to be performed in real time, they can be handled by a general purpose DSP (digital signal processor).

Furthermore, as described herein, one table is addressed based on the amplitude $AM_{IN}[n]$ of the input signal, while the other table is address based on the amplitude $AM_{OUT}[n]$ of the output signal, and the gain update values are calculated based on $IQ_{IN}[n]/IQ_{OUT}[n]$, which is the reciprocal of the gain applied to the input signal by the amplification circuit. Alternatively, the table update values could be calculated based on $IQ_{OUT}[n]/IQ_{IN}[n]$. Furthermore, in some embodiments, the tables are addressed based on the supply to drive ratio, or the supply to drive ratio squared, and this allows the table sizes to be further reduced and/or accuracy to be improved.

A further advantage of embodiments of the present invention is that the tables may be arranged such that their roles switch periodically, thereby facilitating the updating of the predistortion values, without disrupting the processing of the input signal.

While a number of particular embodiments of the present invention have been described in detail, it will be apparent to those skilled in the art that there are many modifications that may be applied.

In particular, it will be apparent to those skilled in the art that there are implementation variations. For example, different algorithms could be used for calculating the gain update values and the complex gain values. Furthermore, parameters such as the number of bits of each input signal are given by way of example only, other values being possible.

Furthermore, as will be apparent to those skilled in the art, the terms "column" and "row" could be applied to either dimension of a memory array, and the tables could be implemented in two or more memory devices.

It will also be apparent to those skilled in the art that further pairs of tables T1, T2 could be provided, allowing different operation based on difference conditions of the input signal. For example, one pair of tables could apply to a first frequency range of the transmitted signal, and a second pair of tables could apply to a second frequency range of the transmitted signal, and the appropriate pair of tables could be selected by detecting the frequency range of the transmitted signal.

What is claimed is:

1. An adaptive predistorter for applying a predistortion gain to an input signal to be amplified by a power amplifier having a variable supply voltage, the predistorter comprising:
   a predistortion gain block adapted to apply a complex gain to a complex input signal;
   a first table implemented in a first memory and comprising a 2-dimensional array of cells storing complex gain values, the first table adapted to output said complex gain values based on an amplitude of the input signal and the value of the variable supply voltage of the power amplifier; and
   a second table implemented in a second memory and comprising a 2-dimensional array of cells storing gain update values for updating the complex gain values of the first table, the gain update values being generated based on an output signal of said power amplifier.

2. The predistorter of claim 1, wherein the complex gain values in said first table are in Cartesian format, and wherein said gain update values in said second table are complex values also in Cartesian format.

3. The predistorter of claim 1, further comprising a table update block adapted to generate updated complex gain values based on said complex gain values of the first table and the gain update values of the second table.

4. The predistorter of claim 3, wherein the table update block is adapted to update the complex gain values based on the following calculation for each address in the first table:

$$G'x,y = Gx,y \cdot G2x,y$$

where G'x,y is the new complex gain value corresponding to address x,y of the first table, Gx,y is the previous complex gain value at address x,y of the first table and G2x,y is the gain update value at address x,y of the second table.

5. The predistorter of claim 1, further comprising a feedback control block adapted to generate said gain update values based on the complex input signal, the output signal of said power amplifier and a previous gain update value stored in said second table.

6. The predistorter of claim 5, wherein a first order infinite impulse response filtering function is applied when generating said gain update values, based on the following calculation:

$$G2'x,y = G2x,y + (G2x,y - m)\alpha$$

wherein G2'x,y is a new gain update value to be stored at address x,y in the second table, G2x,y is the previous gain update value at address x,y in the second table, m is a gain ratio equal to the complex input signal divided by the output signal of the power amplifier, and $\alpha$ is a constant.

7. The predistorter of claim 1, wherein the first and second tables are each addressed by a column address based on the variable supply voltage and a row address, wherein the row address of the first table is based on the amplitude of the complex input signal and the row address of the second table is based on the amplitude of the output signal of the power amplifier.

8. The predistorter of claim 7, wherein the row address input to the first table is equal to:

(AMIN[n]|/VS[n]), and the row address input (y2[n]) to the second table is equal to:

(AMOUT[n]/VS[n]), wherein AMIN[n] is the amplitude of the complex input signal and AMOUT[n] is the amplitude of the complex output signal of the power amplifier converted into digital format and VS[n] is the variable supply voltage converted into digital format.

9. The predistorter of claim 7, wherein the row address input (y1[n]) to the first table is equal to:

(AMIN[n]/VS[n])2, and the row address input (y2[n]) to the second table is equal to:

$$(AMOUT[n]/VS[n])2,$$

wherein AMIN[n] is the amplitude of the complex input signal and AMOUT[n] is the amplitude of the complex output signal of the power amplifier converted into digital format and VS[n] is the variable supply voltage converted into digital format.

10. The predistorter of claim 1, wherein roles of the first and second tables are exchanged periodically.

11. An amplification circuit arrangement comprising:
the predistorter of claim 1 for applying a predistortion gain to an input signal;
a first RF converter for converting the predistorted input signal to an analog signal at a transmission frequency; and
a power amplifier for amplifying the analog signal, the power amplifier being powered by a variable supply voltage.

12. An electronic device comprising:
modulation circuitry for generating the complex input signal; and
the amplification circuit arrangement of claim 11.

13. A method of applying a predistortion gain to a complex input signal to be amplified by a power amplifier having a variable supply voltage, comprising:
applying to the complex input signal, by a predistortion gain block, complex gain values extracted from a first table comprising a 2-dimensional array of cells storing complex gain values, said complex gain values being extracted based on an amplitude of the complex input signal, and a value of the variable supply voltage of the power amplifier; and
accumulating in a 2-dimensional array of a second table gain update values for updating the complex gain values of the first table, the gain update values being generated based on an output signal of said power amplifier.

14. The method of claim 13, further comprising periodically switching the roles of said first and second tables such that said first table is used for accumulating a 2-dimensional array of gain update values generated based on an output signal of said power amplifier, and the second table is used for providing said complex gain values.

15. A digital predistorter comprising:
a predistortion gain block configured to apply a complex gain value to a complex input signal to be amplified by a power amplifier and to output a predistorted signal to the power amplifier;
a first table configured to store complex gain values and to output a selected complex gain value to the predistortion gain block based on an amplitude of the input signal and a value of a variable supply voltage of the power amplifier; and
a second table configured to store gain update values for updating the complex gain values in the first table based on an output signal of the power amplifier.

16. A digital predistorter as defined in claim 15, wherein the first and second tables are implemented in first and second memory arrays, respectively.

17. A digital predistorter as defined in claim 15, wherein the first table comprises a two-dimensional memory array that is addressed based on a value of the variable supply voltage and a value of the input signal amplitude.

18. A digital predistorter as defined in claim 15, further comprising a table update block configured to generate updated complex gain values based on the complex gain values in the first table and the gain update values in the second table.

19. A digital predistorter as defined in claim 18, wherein the table update block is configured to update the complex gain values based on the following calculation for each address in the first table:

$$G'x,y=Gx,y\cdot G2x,y$$

where G'x,y is the new complex gain value corresponding to address x,y of the first table, Gx,y is the previous complex gain value at address x,y of the first table and G2x,y is the gain update value at address x,y of the second table.

20. A digital predistorter as defined in claim 15, further comprising a feedback control block configured to generate the gain update values based on the complex input signal, the output signal of the power amplifier and a previous gain update value stored in the second table.

21. A digital predistorter as defined in claim 20, wherein a first order infinite impulse response filtering function is applied when generating the gain update values, based on the following calculation:

$$G2'x,y=G2x,y+(G2x,y-m)\alpha$$

wherein G2'x,y is a new gain update value to be stored at address x,y in the second table, G2x,y is the previous gain update value at address x,y in the second table, m is a gain ratio equal to the complex input signal divided by the output signal of the power amplifier, and $\alpha$ is a constant.

22. A digital predistorter as defined in claim 15, wherein the first and second tables are each addressed by a column address based on the variable supply voltage, and wherein a row address of the first table is based on the amplitude of the complex input signal and a row address of the second table is based on the amplitude of the output signal of the power amplifier.

23. A digital predistorter as defined in claim 15, further comprising multiplexers configured to periodically switch roles of the first and second tables.

24. A digital predistortion method comprising:
storing, in a first table, complex gain values;
applying, by a predistortion gain block, to a complex input signal to be amplified by a power amplifier, a complex gain value selected from the first table based on an amplitude of the input signal and a value of a variable power supply of the power amplifier;
storing, in a second table, gain update values based on an output signal of the power amplifier; and
updating, by a table update block, the complex gain values in the first table based on the gain update values in the second table.

25. A digital predistortion method as defined in claim 24, further comprising generating, by a feedback control block, the gain update values based on the complex input signal, the output signal of the power amplifier and a previous gain update value stored in the second table.

26. A digital predistortion method as defined in claim 24, further comprising periodically switching roles of the first and second tables.

* * * * *

UNITED STATES PATENT AND TRADEMARK OFFICE
CERTIFICATE OF CORRECTION

PATENT NO. : 8,411,792 B2  
APPLICATION NO. : 12/849270  
DATED : April 2, 2013  
INVENTOR(S) : Vincent Pinon Page 1 of 1

It is certified that error appears in the above-identified patent and that said Letters Patent is hereby corrected as shown below:

In the Specifications:

In col. 5, please delete lines 27-33 as shown.

"In this example, the division by $V_S[n]$ is relatively simple, as $V_S[n]$ varies slowly and has few possible values. Other functions are possible, such as:

$y_1[n] = AM_{IN}[n]^2/V_S[n]^2$, and $y_2[n] = AM_{OUT}[n]^2/V_S[n]^2$"

Signed and Sealed this  
Fourteenth Day of May, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,411,792 B2  
APPLICATION NO. : 12/849270  
DATED : April 2, 2013  
INVENTOR(S) : Vincent Pinon It is certified that error appears in the above-identified patent and that said Letters Patent is hereby corrected as shown below:

In the Claims

At column 10, line 54 should read:

$(AM_{IN}[n]/V_S[n])$, line 58 should read:

$(AM_{OUT}[n]/V_S[n])$, line 59 should read:

wherein $AM_{IN}[n]$ is the amplitude of the complex input line 60 should read:

signal and $AM_{OUT}[n]$ is the amplitude of the complex line 62 should read:

tal format and $V_S[n]$ is the variable supply voltage conline 67 should read:

$(AM_{IN}[n]/V_S[n])^2$,

At column 11, line 4 should read:

$(AM_{OUT}[n]/V_S[n])^2$, line 5 should read:

wherein $AM_{IN}[n]$ is the amplitude of the complex input

At column 11, line 6 should read:

signal and $AM_{OUT}[n]$ is the amplitude of the complex line 8 should read:

tal format and $V_S[n]$ is the variable supply voltage con-

Signed and Sealed this  
Sixteenth Day of December, 2014

Michelle K. Lee  
*Deputy Director of the United States Patent and Trademark Office*